US011678529B2

(12) United States Patent
Kang et al.

(10) Patent No.: US 11,678,529 B2
(45) Date of Patent: Jun. 13, 2023

(54) DISPLAY DEVICE INCLUDING BLACK LAYER CORRESPONDING TO INTERVAL BETWEEN ADJACENT BRANCHES AND METHOD OF MANUFACTURING THE SAME

(71) Applicant: Samsung Display Co., Ltd., Yongin-Si (KR)

(72) Inventors: Seungbae Kang, Yongin-si (KR); Heesung Yang, Yongin-si (KR); Woojin Cho, Yongin-si (KR); Byoungkwon Choo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 17/239,150

(22) Filed: Apr. 23, 2021

(65) Prior Publication Data

US 2022/0130934 A1    Apr. 28, 2022

(30) Foreign Application Priority Data

Oct. 22, 2020  (KR) .................... 10-2020-0137471

(51) Int. Cl.
*H10K 59/126*  (2023.01)
*H10K 59/131*  (2023.01)
*H10K 71/00*  (2023.01)
*H10K 59/12*  (2023.01)
*G09G 3/3233* (2016.01)
*H01L 27/32*  (2006.01)
*H01L 51/56*  (2006.01)

(52) U.S. Cl.
CPC ...... *H01L 27/3272* (2013.01); *H01L 27/3276* (2013.01); *H01L 51/56* (2013.01);
(Continued)

(58) Field of Classification Search
CPC . H01L 27/3272; H01L 27/3276; H01L 51/56; H01L 2227/323; G09G 2310/0281
(Continued)

(56) References Cited

U.S. PATENT DOCUMENTS 9,093,660 B2   7/2015  Yang et al.
9,166,199 B2  10/2015  Kim et al.
(Continued)

FOREIGN PATENT DOCUMENTS

CN   111785742 A  * 10/2020  ........... H01L 27/124
KR   10-1480928 B1    1/2015
(Continued)

*Primary Examiner* — Matthew E. Gordon
(74) *Attorney, Agent, or Firm* — Innovation Counsel LLP

(57) ABSTRACT

Provided are a display device and a method of manufacturing the display device. The display device includes a substrate including a display area and a peripheral area outside the display area, a plurality of data lines disposed in the display area, a plurality of lines disposed in the display area, respectively connected to the plurality of data lines, and configured to respectively transmit a data signal from a driving circuit disposed in the peripheral area to the plurality of data lines, an insulating layer covering the plurality of lines; and a light-emitting element disposed on the insulating layer, wherein each of the plurality of lines comprises a plurality of branches branched in a direction crossing an extending direction of the line, and a black layer is disposed on an insulating layer at a position corresponding to an interval between a plurality of adjacent branches in a vertical direction.

13 Claims, 14 Drawing Sheets

(52) U.S. Cl.
CPC ... *G09G 3/3233* (2013.01); *G09G 2300/0809* (2013.01); *G09G 2310/0202* (2013.01); *G09G 2310/0281* (2013.01); *H01L 2227/323* (2013.01)

(58) Field of Classification Search
USPC .......................................................... 257/40
See application file for complete search history.

(56) References Cited

U.S. PATENT DOCUMENTS

| | | | |
|---|---|---|---|
| 10,199,608 | B2 | 2/2019 | Woo et al. |
| 2017/0213879 | A1* | 7/2017 | Yang ................... H01L 51/5228 |
| 2018/0331326 | A1 | 11/2018 | Woo et al. |
| 2019/0206976 | A1* | 7/2019 | Jeong ................... G09G 3/3275 |
| 2019/0245017 | A1* | 8/2019 | Jeon ................... H01L 27/3272 |
| 2020/0328263 | A1 | 10/2020 | Choi et al. |
| 2021/0336065 | A1* | 10/2021 | Chen ................ G02F 1/133388 |

FOREIGN PATENT DOCUMENTS

| | | | | | |
|---|---|---|---|---|---|
| KR | 10-2015-0058961 | A | | 5/2015 | |
| KR | 20150058961 | A | * | 5/2015 | ......... H01L 27/3276 |
| KR | 10-1780815 | B1 | | 9/2017 | |
| KR | 10-2018-0125674 | A | | 11/2018 | |
| KR | 10-1995729 | B1 | | 7/2019 | |
| KR | 10-2019-0096472 | A | | 8/2019 | |
| KR | 10-2020-0006647 | A | | 1/2020 | |
| KR | 10-2020-0119946 | A | | 10/2020 | |

* cited by examiner

DISPLAY DEVICE INCLUDING BLACK LAYER CORRESPONDING TO INTERVAL BETWEEN ADJACENT BRANCHES AND METHOD OF MANUFACTURING THE SAME

CROSS-REFERENCE TO RELATED APPLICATION

This application is based on and claims priority under 35 U.S.C. § 119 to Korean Patent Application No. 10-2020-0137471, filed on Oct. 22, 2020, in the Korean Intellectual Property Office, the disclosure of which is incorporated by reference herein in its entirety.

BACKGROUND

1. Field

The present disclosure generally relates to a display device and a method of manufacturing the display device. More particularly, the present disclosure relates to a display device capable of improving display quality by reducing diffuse reflection and preventing pattern visibility, and a method for manufacturing the same.

2. Description of Related Art

Generally, display devices may be used in mobile devices such as smart phones, laptop computers, digital cameras, camcorders, portable information terminals, notebook computers, and tablet personal computers, or electronic devices such as desktop computers, televisions, outdoor advertisement boards, display devices, dashboards for vehicles, and head up displays (HUDs).

As the display field for visually displaying various electrical signal information has been rapidly developed, various display devices having excellent characteristics such as small thickness, light weight, and low power consumption have been introduced. Additionally, a dead area (i.e., bezel) of the display device has been reduced, and thus, a display area has been increased dramatically. However, there is still an issue with display quality of the display device due to reflection or flickering.

SUMMARY

The display device may separate or spread the color of light that is reflected from the inside of the device and emitted to the outside, thereby degrading the display quality. In addition, patterned lines may be recognized in a display area.

Embodiments of the present disclosure provide a display device capable of displaying high-quality images by reducing diffuse reflection and preventing pattern visibility, and a method for manufacturing the display device.

The technical problems to be solved by the present disclosure are only examples, and the scope of the present disclosure is not limited thereto.

Additional aspects will be set forth in part in the description that follows and, in part, will be apparent from the description, or may be learned by practice of the embodiments of the present disclosure.

According to an aspect of the present disclosure, a display device includes a substrate including a display area and a peripheral area which is disposed outside the display area, a plurality of data lines disposed in the display area, a plurality of lines disposed in the display area, respectively connected to the plurality of data lines, and configured to respectively transmit a data signal from a driving circuit disposed in the peripheral area to the plurality of data lines, an insulating layer covering the plurality of lines, and a light-emitting element disposed on the insulating layer, wherein each of the plurality of lines includes a plurality of branches branched in a direction crossing an extending direction of the line, and a black layer is disposed on the insulating layer at a position corresponding to an interval which is disposed between a plurality of adjacent branches in a vertical direction.

The black layer may be disposed in a trench that is recessed from an upper surface of the insulating layer.

The light-emitting element may include a pixel electrode, an emission layer, and an opposite electrode, and the black layer may be disposed adjacent to the pixel electrode and overlap the interval which is disposed between the plurality of adjacent branches.

The black layer may be disposed at every interval which is disposed between a plurality of branches protruding from lines disposed around the pixel electrode.

The black layer may include any one of a black organic material, a black inorganic material, carbon black, carbon nanotube, and metal black.

The plurality of lines may be disposed to be parallel and spaced apart from each other, and the interval is disposed between ends of a pair of branches protruding toward each other from two adjacent lines.

Each of the plurality of lines may include a first portion, a second portion, a third portion, and the second portion connects the first portion to the third portion. Each of the first portion and the third portion may extend in the extending direction of the plurality of data lines, and the second portion may extend in a direction crossing the extending direction of the plurality of data lines.

Each of the plurality of lines may include first branches protruding from the first portion and the third portion, respectively, and second branches protruding from the second portion.

According to another aspect of the present disclosure, a display device includes a substrate comprising a display area, a plurality of lines, each of the plurality of lines extending in one direction of the display area and each of the plurality of lines comprising a plurality of branches branched in a direction crossing an extending direction, an insulating layer overlapping the plurality of lines, and a light-emitting element disposed on the insulating layer, wherein a black layer is disposed on an insulating layer at a position corresponding to an interval which is disposed between a plurality of adjacent branches in a vertical direction.

The black layer may be disposed in a trench that is recessed from an upper surface of the insulating layer.

The light-emitting element may include a pixel electrode, an emission layer, and an opposite electrode, and the black layer may be disposed adjacent to the pixel electrode and overlap the interval which is disposed between the plurality of adjacent branches.

The black layer may be disposed at every interval which is disposed between a plurality of branches protruding from the lines disposed around the pixel electrode.

The black layer may include any one of a black organic material, a black inorganic material, carbon black, carbon nanotube, and metal black.

According to another aspect of the present disclosure, a method of manufacturing a display device includes forming a plurality of data lines in a display area on a substrate, forming a plurality of lines in the display area, the plurality of lines being respectively connected to the plurality of data lines and each the plurality of lines having a plurality of branches branched in a direction crossing an extending direction of each of the lines, forming an insulating layer covering the plurality of lines, forming a black layer disposed on the insulating layer at a position corresponding to an interval which is disposed between a plurality of adjacent branches in a vertical direction, and forming a light-emitting element on the insulating layer.

The forming of the black layer may include forming a trench recessed from an upper surface of the insulating layer, coating a black-layer raw material on the insulating layer, polishing the black-layer raw material to planarize a surface of the insulating layer, and forming the black layer in the trench.

The trench may be formed at a position corresponding to an interval which is disposed between the plurality of branches in the vertical direction.

A light-emitting element including a pixel electrode, an emission layer, and an opposite electrode may be formed on the insulating layer, and the black layer may be disposed adjacent to the pixel electrode, and overlap the interval which is disposed between the plurality of adjacent branches.

The black layer may be disposed at every interval which is disposed between a plurality of branches protruding from the lines disposed around the pixel electrode.

The plurality of lines may be disposed in parallel to each other, and the interval is disposed between ends of a pair of branches protruding toward each other from two adjacent lines.

Each of the plurality of lines may include a first portion, a second portion, a third portion, and the second portion connects the first portion and the third portion. Each of the first portion and the third portion may extend in the extending direction of the plurality of data lines, and the second portion may extend in a direction crossing the extending direction of the plurality of data lines.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
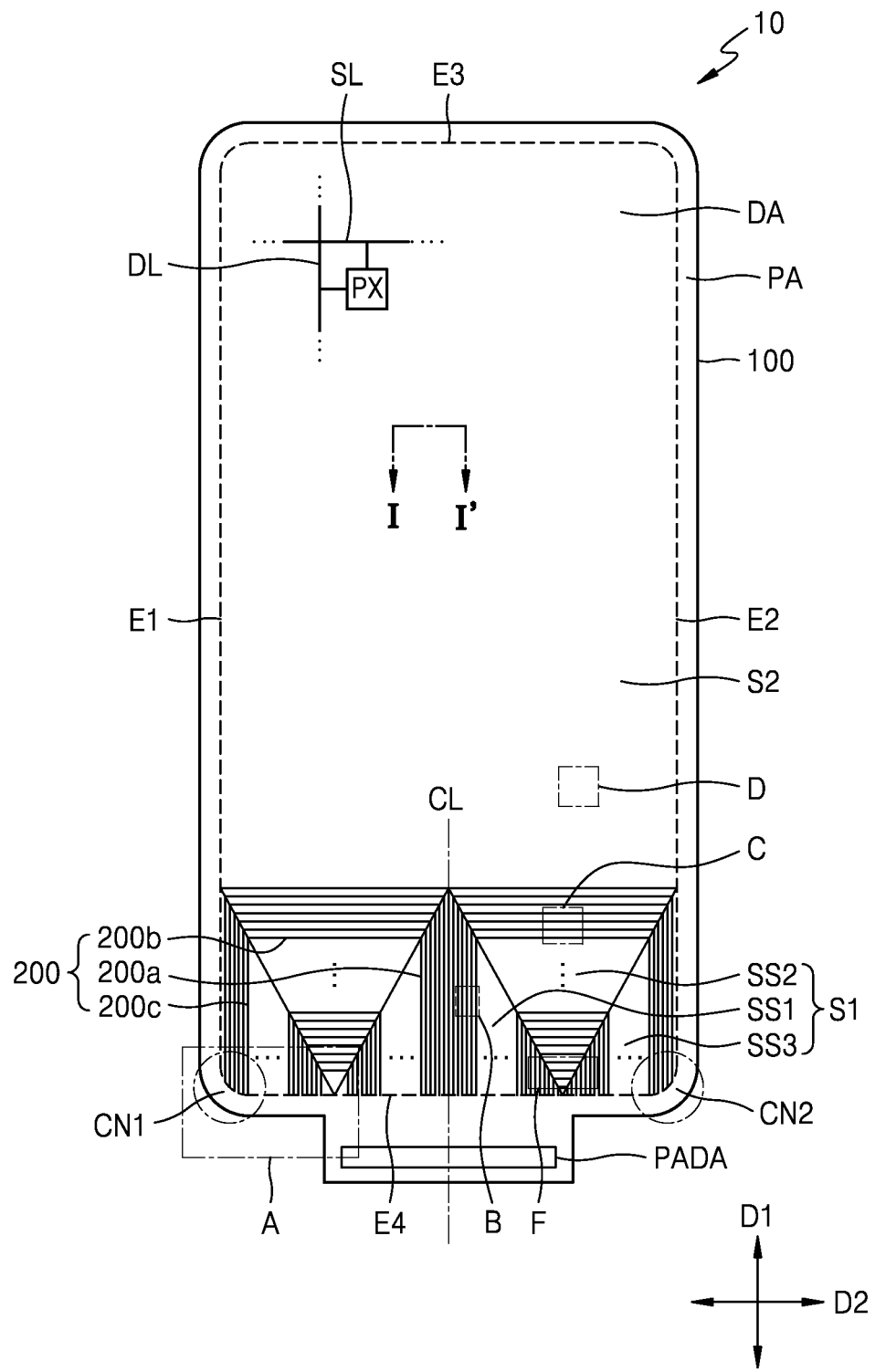
FIG. 1 is a plan view illustrating an example of a display panel according to an embodiment.

Reference will now be made in detail to embodiments, examples of which are illustrated in the accompanying drawings, wherein like reference numerals refer to like elements throughout the present disclosure. In this regard, the present embodiments may have different forms and should not be construed as being limited to the descriptions set forth herein. Accordingly, embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Since the present disclosure can apply various changes and have various embodiments, embodiments are illustrated in the drawings and will be described in detail in the detailed description. Effects and features of the present disclosure and methods of achieving the same will be apparent with reference to embodiments described in detail with reference to the drawings. However, the present disclosure is not limited to the embodiments described below, but may be implemented in various forms.

In the following embodiments, the terms "first" and "second" are not limited and are used to distinguish one element from another element.

In the following embodiment, an expression used in the singular encompasses an expression of the plural unless the context expressly indicates otherwise.

In the following embodiments, the terms comprising or including means that a feature or an element described in the present disclosure is present, and do not preclude the possibility that one or more other features or elements are added.

In the following embodiments, when a portion such as a membrane, an area, and an element is arranged on or above another portion, the portion may be arranged directly above the other portion, or may be arranged between the other portion and the other portion.

In the drawings, for convenience of description, a size of the elements may be exaggerated or reduced. For example, the size and thickness of each element shown in the drawings are arbitrarily shown for convenience of description, and thus, the present disclosure is not limited thereto.

In this specification, "A and/or B" denotes A, B, or A and B. Also, in this specification, "at least one of A and B" denotes A, B, or A and B.

In the following embodiments, the term "extending in a first direction or a second direction" includes not only extending in a straight-line shape but also extending in a zigzag or curved line along the first direction or the second direction.

In the following embodiments, "on a plane" refers to a position of an object when viewed from above, and "on a cross-section" refers to a position of the object when viewed from side. In the following embodiments, when "overlapping" is used, "overlapping" includes "planar" and "cross-sectional" overlapping.

Hereinafter, embodiments of the present disclosure will be described in detail with reference to the accompanying drawings, and like reference numerals denote like elements throughout the drawings.

Figure 2:
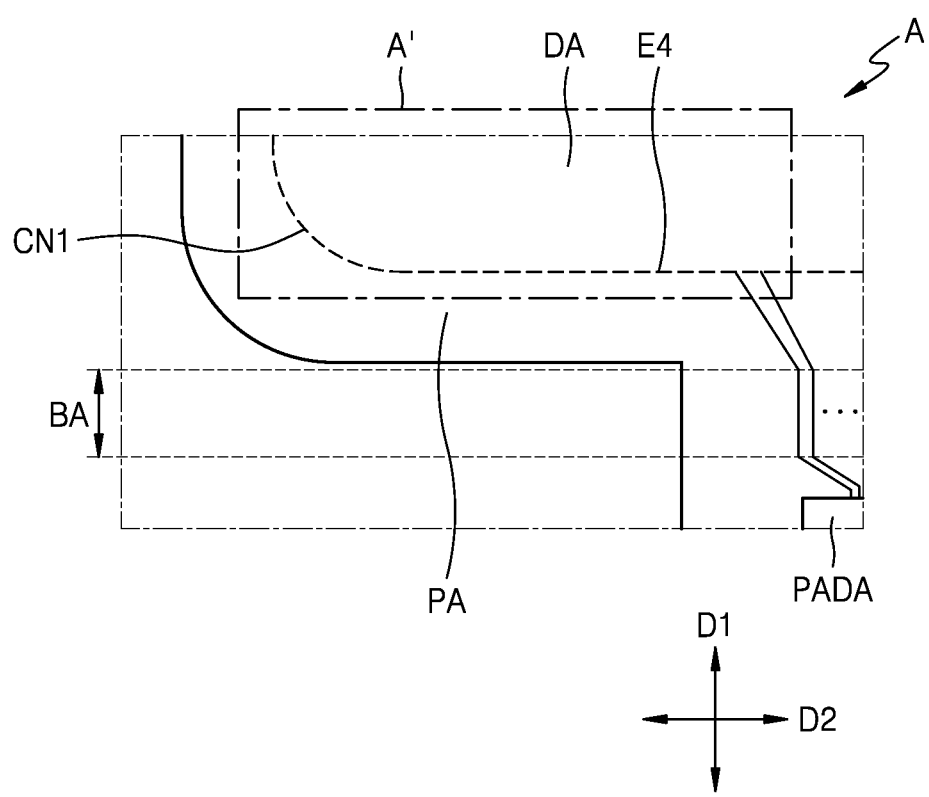
FIG. 2 is an enlarged view illustrating region A of FIG. 1.
Figure 3:
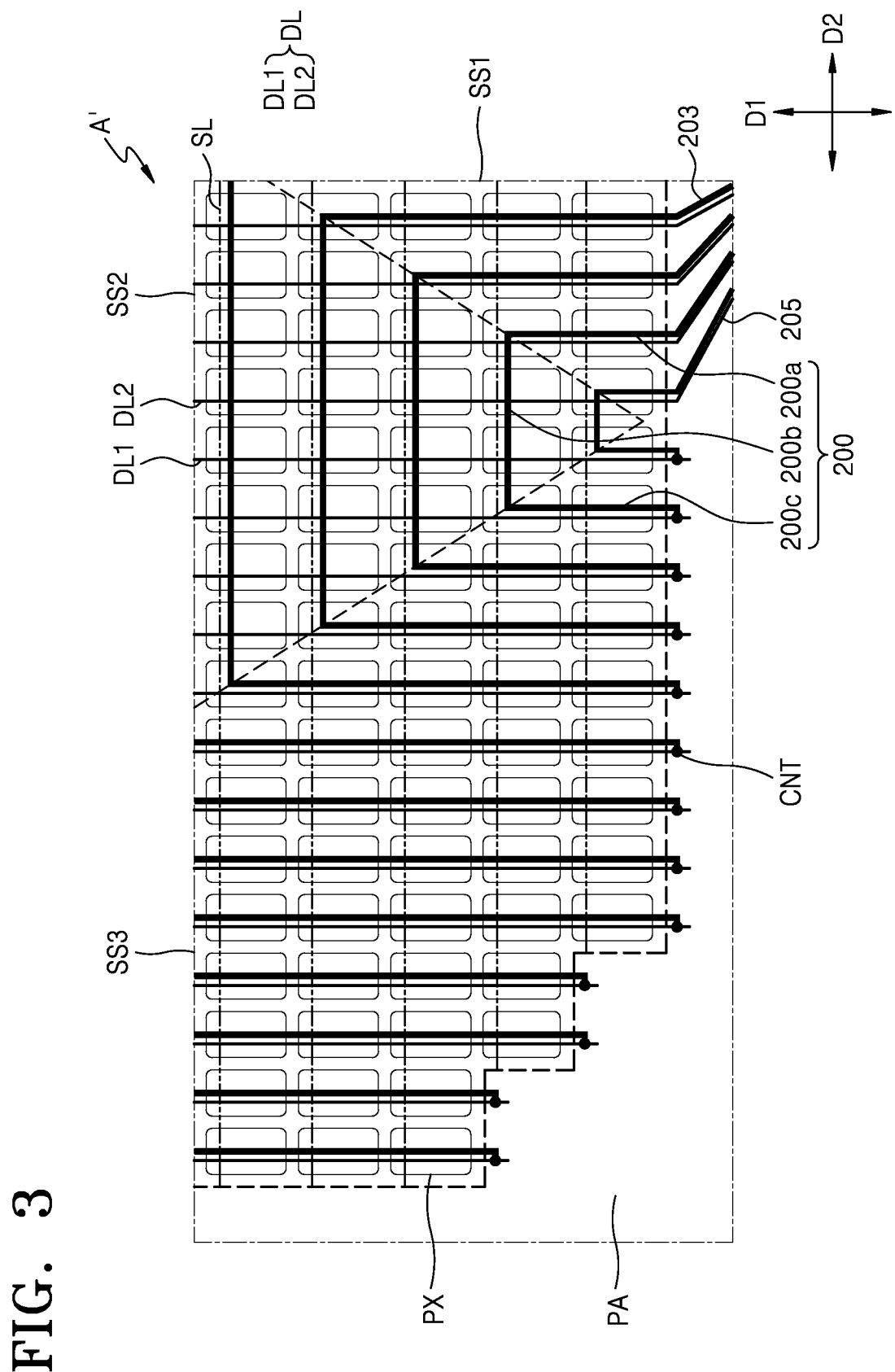
FIG. 3 is a partially enlarged plan view of region A' of FIG. 2.

FIG. 1 is a plan view illustrating an example of a display panel 10 according to an embodiment, FIG. 2 is an enlarged view of region A in FIG. 1, and FIG. 3 is a partially enlarged plan view of region A' in FIG. 2.

Referring to FIG. 1, a display device according to an embodiment may include the display panel 10 including a substrate 100. The display panel 10 may include a display area DA and a peripheral area PA outside the display area DA.

The display area DA may be substantially rectangular. The display area DA may include a first edge E1 and a second edge E2 facing each other, and a third edge E3 and a fourth edge E4 facing each other. The first edge E1 and the second edge E2 may correspond to long edges, and the third edge E3 and the fourth edge E4 may correspond to short edges. However, the present disclosure is not limited thereto. For example, the first edge E1 and the second edge E2 may correspond to short edges, and the third edge E3 and the fourth edge E4 may correspond to long edges. A pad area PADA may be adjacent to the fourth edge E4.

A first corner CN1 of the display area DA may have a round shape. The first corner CN1 may connect the first edge E1 to the fourth edge E4. A second corner CN2 of the display area DA may have a round shape. The second corner CN2 may connect the second edge E2 to the fourth edge E4. In an embodiment, the display area DA may have a round shape at a portion other than an edge thereof.

The peripheral area PA may surround the display area DA. The peripheral area PA may be an area in which pixels PX are not arranged. The peripheral area PA may include a power line for supplying power to drive a display element.

The peripheral area PA may include the pad area PADA to which various electronic elements or printed circuit boards are electrically attached. A plurality of pads may be arranged in the pad area PADA, and the plurality of pads may be electrically connected to a data driver.

In an embodiment, the data driver transmitting data signals may be arranged on a film electrically connected to the pads in the pad area PADA in a chip on film (COF) scheme. In another embodiment, the data driver may be directly arranged on the substrate 100 in a chip on glass (COG) or chip on plastic (COP) scheme.

In the display device, a portion of the substrate 100 may be bent to minimize an area of the peripheral area PA recognized by a user. The peripheral area PA may include a bending area BA, and the bending area BA may be arranged between the pad area PADA and the display area DA. When the bending area BA is bent, at least a portion of the pad area PADA may overlap the display area DA. Accordingly, the user may recognize that the display area DA occupies most of the display device.

FIG. 3 shows a portion of the first corner CN1 which is the part of region A' in FIG. 2. The display device or the electronic device including the display device according to the present embodiment may be recognized as having a round shape, that is, a curved shape when a user views the display device or the electronic device in a general use environment.

However, in an environment in which the first corner CN1 is enlarged to observe lines having a width of several micrometers or several tens of micrometers, the first corner CN1 may have a straight-line shape bent several times in a first direction D1 and a second direction D2.

When the first corner CN1 is enlarged, although the first corner CN1 is shown to have a straight-line shape bent a plurality of times, it may be recognized that the first corner CN1 has a round shape, that is, a curved shape in a general use environment. Thus, when each of the first corner CN1 and the second corner CN2 has a round shape, the first corner CN1 and the second corner CN2 may have a substantially round shape and a straight-line shape bent a plurality of times.

The display area DA may include the plurality of pixels PX and signal lines for transmitting an electrical signal to the pixels PX.

Each of the pixels PX includes a display element and a pixel circuit for driving the display element. The display element may be an organic light-emitting diode, and the pixel circuit may include a plurality of transistors and a capacitor. The plurality of pixels PX may include first pixels emitting first color light, second pixels emitting second color light, and third pixels emitting third color light. For example, the first pixel may be a red pixel R, the second pixel may be a green pixel G, and the third pixel may be a blue pixel B.

The signal lines for transmitting an electrical signal to the plurality of pixels PX may include a plurality of scan lines SL and a plurality of data lines DL. Each of the plurality of data lines DL may extend in the first direction D1, and each of the plurality of scan lines SL may extend in the second direction D2. The scan lines SL may be arranged in a plurality of rows to transmit scan signals to the pixels PX, and the data lines DL may be arranged in a plurality of columns to transmit data signals to the pixels PX.

Each of the pixels PX may be connected to at least one corresponding scan line SL among the plurality of scan lines SL and a corresponding data line DL among the plurality of data lines DL. The data lines DL may include first data lines DL1 and second data lines DL2. The first data lines DL1 may be data lines connected to first lines 200. The second data lines DL2 may be data lines other than the first data lines DL1.

The first lines 200 may be arranged in the display area DA to transmit an electrical signal received from the pad area PADA to signal lines connected to the pixels PX. For example, the first lines 200 may be connected to the first data lines DL1 to transmit data signals received from the pads in the pad area PADA to the first data lines DL1. Each of the first lines 200 may be arranged on a layer which is different from a layer on which the scan lines SL and the data lines DL of the pixel PX are arranged.

The first lines 200 arranged on a left side of a virtual center line (CL in FIG. 1) passing through a center of the display panel 10 in the second direction D2 and the first lines 200 arranged on a right side of the center line CL may be symmetrical to each other in left and right directions with respect to the center line CL.

Each of the first lines 200 may include a first portion 200a and a third portion 200c each extending in the first direction D1 and a second portion 200b extending in the second direction D2. The second portion 200b may connect the first portion 200a to the third portion 200c. The first portion 200a, the second portion 200b, and the third portion 200c may be integrally formed.

The first portion 200a may be arranged at the center line CL, and the third portion 200c may be arranged at the first and second corners CN1 and CN2. The first portion 200a may extend away from the pad area PADA from the fourth edge E4 facing the pad area PADA in the first direction D1. The second portion 200b may be bent from the first portion 200a and extend in the second direction D2 toward the first edge E1 or the second edge E2. The third portion 200c may be bent from the second portion 200b and extend in the first direction D1 toward the fourth edge E4. For example, each of the first lines 200 may have a substantially U-shape.

The display area DA may be divided into a plurality of areas depending on whether the first lines 200 are arranged. For example, the display area DA may include a first area S1 in which the first lines 200 are arranged and a second area S2 excluding the first area S1. The second area S2 may be an area where the first lines 200 are not located.

The first area S1 may be divided into a plurality of sub-areas according to an extension direction of the first lines 200. For example, the first area S1 may include a first sub-area SS1 in which the first portions 200a of the first lines 200 are arranged, a second sub-area SS2 in which the second portions 200b are arranged, and a third sub-area SS3 in which the third portions 200c are arranged. The first sub-area SS1, the second sub-area SS2, and the third sub-area SS3 located on the right side of the center line CL may be symmetrical to the first sub-area SS1, the second sub-area SS2, and the third sub-area SS3 located on the left side of the center line CL, respectively.

The first portion 200a of each of the first lines 200 may be parallel to a second data line DL2 and may partially overlap or be adjacent to the second data line DL2. The first portion 200a of each of the first lines 200 may extend in parallel to the second data line DL2 arranged in one of a plurality of columns. The second portion 200b of each of the first lines 200 may be parallel to the scan line SL, and may partially overlap or be adjacent to the scan line SL. The second portion 200b of each of the first lines 200 may extend in parallel with the scan line SL arranged in one of a plurality of rows. The third portion 200c of each of the first lines 200 may be parallel to a first data line DL1 and may partially overlap or be adjacent to the first data line DL1. The third portion 200c of each of the first lines 200 may extend in parallel to the first data line DL1 arranged in one of the columns.

Second lines 203 and third lines 205 may be further arranged in the peripheral area PA. Each of the first lines 200 may have one end connected to the first data line DL1 and the other end connected to the second line 203. One end of the second line 203 may be connected to the other end of the first line 200, and the other end of the second line 203 may be connected to a pad of the pad area PADA. The second line 203 may be a portion where the first portion 200a of the first line 200 extends to the peripheral area PA. According to an embodiment, the second line 203 may be a line arranged on a layer different from a layer on which the first line 200 is arranged, and may be electrically connected to the first portion 200a of the first line 200 in the peripheral area PA. The third portion 200c of the first line 200 may be electrically connected to the first data line DL1 in a contact portion CNT of the peripheral area PA.

One end of the third line 205 may be connected to the second data line DL2, and the other end of the third line 205 may be connected to a pad of the pad area PADA. The third line 205 may be a portion where the second data line DL2 extends to the peripheral area PA. In an embodiment, the third line 205 may be a line arranged on a layer different from a layer on which the second data line DL2 is arranged, and may be electrically connected to the second data line DL2 in the peripheral area PA.

Figure 4:
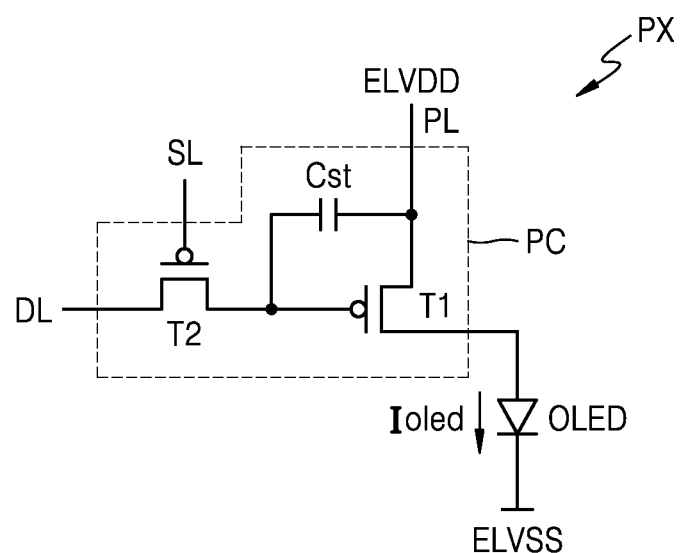
FIGS. 4 and 5 are equivalent circuit diagrams illustrating pixels arranged in a display panel according to an embodiment.
Figure 5:
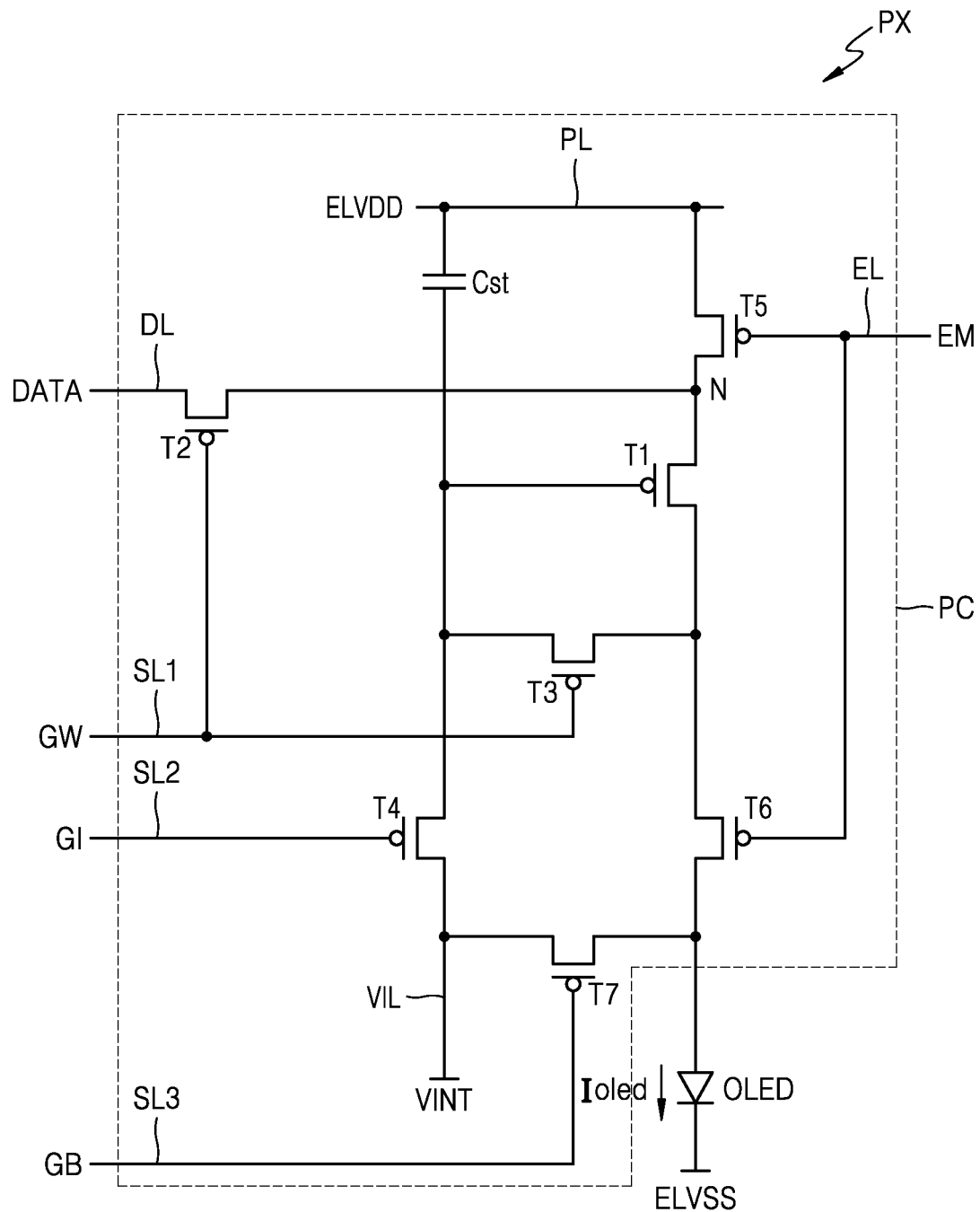

FIGS. 4 and 5 are equivalent circuit diagrams illustrating the pixel PX arranged on the display panel 10 according to an embodiment.

Referring to FIG. 4, the pixel PX may include a pixel circuit PC and an organic light-emitting diode OLED that is a display element connected to the pixel circuit PC. The pixel circuit PC may include a first transistor T1, a second transistor T2, and a capacitor Cst. Each pixel PX may emit red, green, blue, or white light from the organic light-emitting diode OLED. The first transistor T1 and the second transistor T2 may be thin-film transistors.

The first transistor T1 may be a driving transistor, may be connected to a power voltage line PL and the capacitor Cst, and may control a driving current flowing from a power voltage line PL to the organic light-emitting diode OLED according to a voltage stored in the capacitor Cst. The organic light-emitting diode OLED may include a pixel electrode and an opposite electrode, and the opposite electrode may receive a second power voltage ELVSS. The organic light-emitting diode OLED may receive a driving current Ioled from the first transistor T1 to emit light, thereby displaying an image.

The second transistor T2 may be a switching transistor, may be connected to the scan line SL and the data line DL, and may transmit a data signal received via the data line DL to the first transistor T1 according to a switching voltage received via the scan line SL. The capacitor Cst may be connected to the second transistor T2 and the power voltage line PL, and may store a voltage corresponding to a voltage difference between a voltage corresponding to the data signal received from the second transistor T2 and a first power voltage ELVDD applied to the power voltage line PL. The power voltage line PL may be spaced apart from the scan line SL or the data line DL in parallel.

FIG. 4 illustrates that the pixel circuit PC includes two transistors and one capacitor. In another embodiment, a number of transistors and a number of capacitors may be variously changed according to the design of the pixel circuit PC.

Referring to FIG. 5, each pixel PX may include signal lines SL1, SL2, SL3, EL, and DL, an initialization voltage line VIL, and the power voltage line PL. According to another embodiment, at least one of the signal lines SL1, SL2, SL3, EL, and DL, the initialization voltage line VIL, and/or the power voltage line PL may be shared by neighboring pixels.

The signal lines SL1, SL2, SL3, EL, and DL may include a first scan line SL1 for transmitting a first scan signal GW, a second scan line SL2 for transmitting a second scan signal GI, a third scan line SL3 for transmitting a third scan signal GB, an emission control line EL for transmitting an emission control signal EM, and the data line DL for transmitting a data signal DATA. The third scan line SL3 may be the second scan line SL2 of a next row, and the third scan signal GB may be the second scan signal GI of a next row.

The power voltage line PL may transfer the first power voltage ELVDD to the first transistor T1, and the initialization voltage line VIL may transfer an initialization voltage VINT for initializing the first transistor T1 and the organic light-emitting diode OLED to the pixel PX.

The first scan line SL1, the second scan line SL2, the third scan line SL3, the emission control line EL, and the initialization voltage line VIL may extend in the second direction (D2 of FIG. 1) and may be spaced apart from each other in each row. The data line DL and the power voltage line PL may extend in the first direction (D1 of FIG. 1) and may be spaced apart from each other in each column.

The pixel circuit PC of the pixel PX may include a plurality of first to seventh transistors T1, T2, T3, T4, T5, T6, and T7 and a capacitor Cst. The first to seventh transistors T1, T2, T3, T4, T5, T6, and T7 may be thin-film transistors.

The first transistor T1 may be connected to the power voltage line PL via a fifth transistor T5, and may be electrically connected to the organic light-emitting diode OLED via a sixth transistor T6. The first transistor T1 may serve as a driving transistor, and receive the data signal DATA according to a switching operation of the second transistor T2 and supply the driving current Ioled to the organic light-emitting diode OLED.

The second transistor T2 may be connected to the first scan line SL1 and the data line DL, and may be turned on according to the first scan signal GW received through the first scan line SL1 to perform a switching operation of transmitting the data signal DATA transmitted to the data line DL to a node N.

The third transistor T3 may be connected to the organic light-emitting diode OLED via the sixth transistor T6. The third transistor T3 may be turned on according to the first scan signal GW received through the first scan line SL1 to diode-connect the first transistor T1.

The fourth transistor T4 may be turned on according to the second scan signal GI received through the second scan line SL2, and may transfer the initialization voltage VINT from the initialization voltage line VIL to a gate electrode of the first transistor T1 to initialize the gate voltage of the first transistor T1.

The fifth transistor T5 and the sixth transistor T6 may be simultaneously turned on according to the emission control signal EM received through the emission control line EL, and may form a current path so that the driving current Ioled may flow in a direction from the power voltage line PL to the organic light-emitting diode OLED.

The seventh transistor T7 may be turned on according to the third scan signal GB transferred through the third scan line SL3, and may transfer the initialization voltage VINT from the initialization voltage line VIL to the organic light-emitting diode OLED to initialize the organic light-emitting diode OLED. However, in another embodiment, the seventh transistor T7 may be omitted.

The fourth transistor T4 may be connected to the second scan line SL2, and the seventh transistor T7 may be connected to the third scan line SL3. According to another embodiment, the seventh transistor T7 may be connected to the second scan line SL2 together with the fourth transistor T4.

The capacitor Cst may be connected to the power voltage line PL and the gate electrode of the first transistor T1, and may store and maintain a voltage corresponding to a voltage difference between voltages at both ends of the capacitor Cst to maintain a voltage applied to the gate electrode of the first transistor T1.

The organic light-emitting diode OLED may include the pixel electrode and the opposite electrode, and the opposite electrode may receive the second power voltage ELVSS. The organic light-emitting diode OLED may receive the driving current $I_{oled}$ from the first transistor T1 to emit light, thereby displaying an image.

Figure 6:
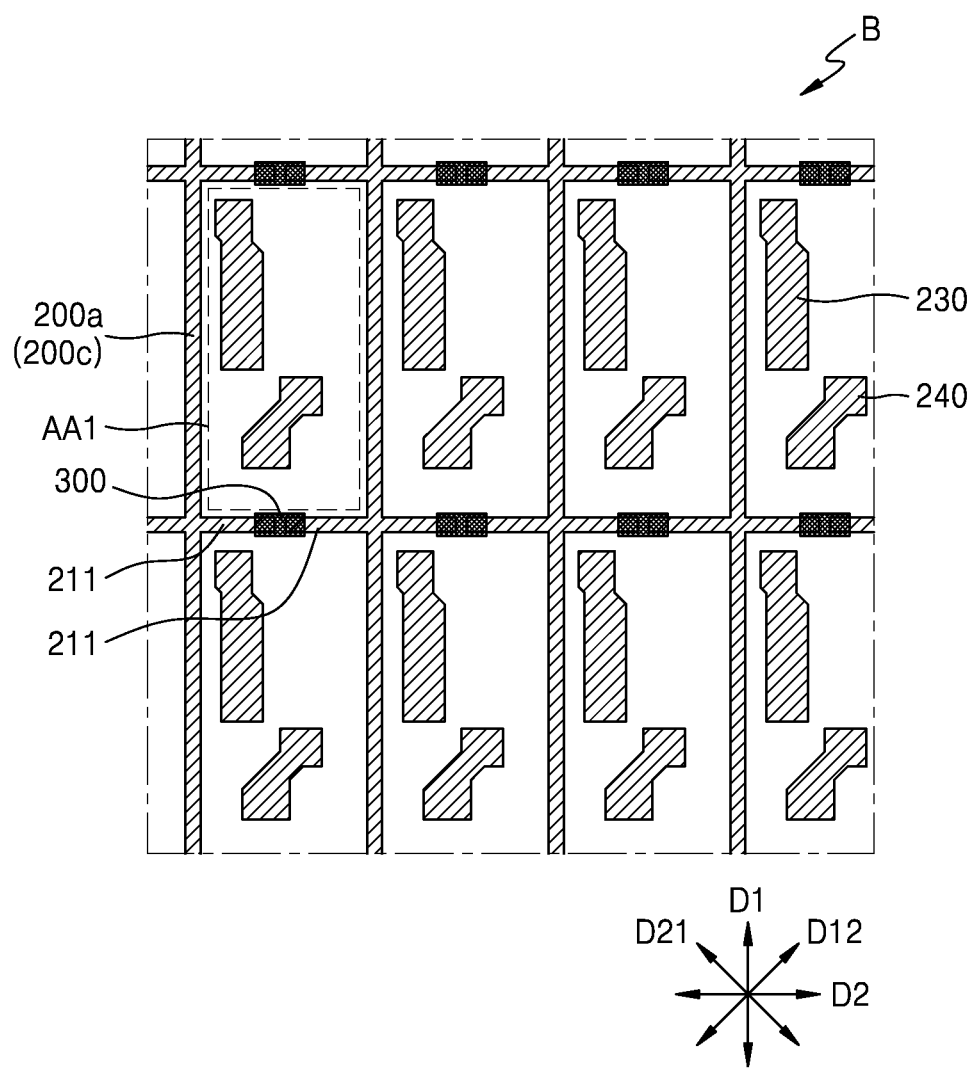
FIGS. 6, 7, and 8 are plan views illustrating examples of lines and conductive patterns according to some embodiments.
Figure 7:
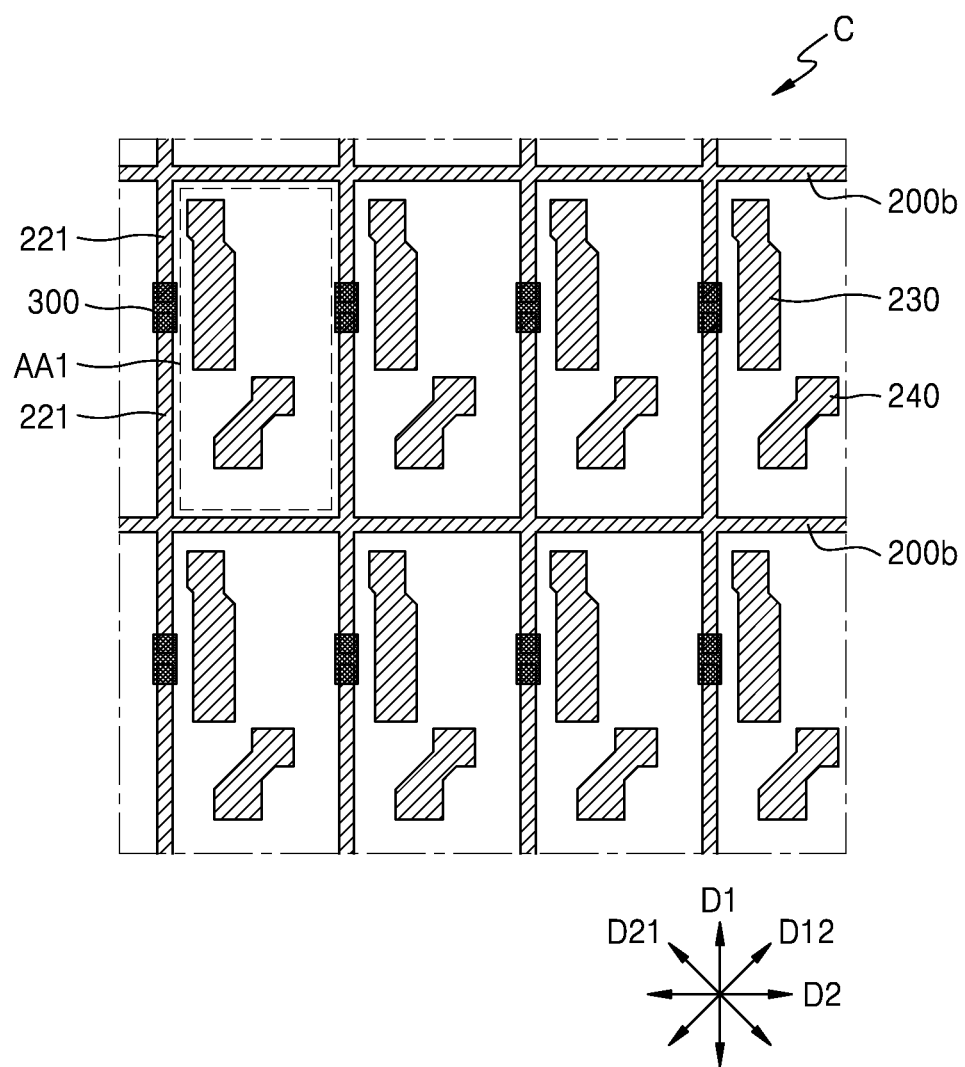
Figure 8:
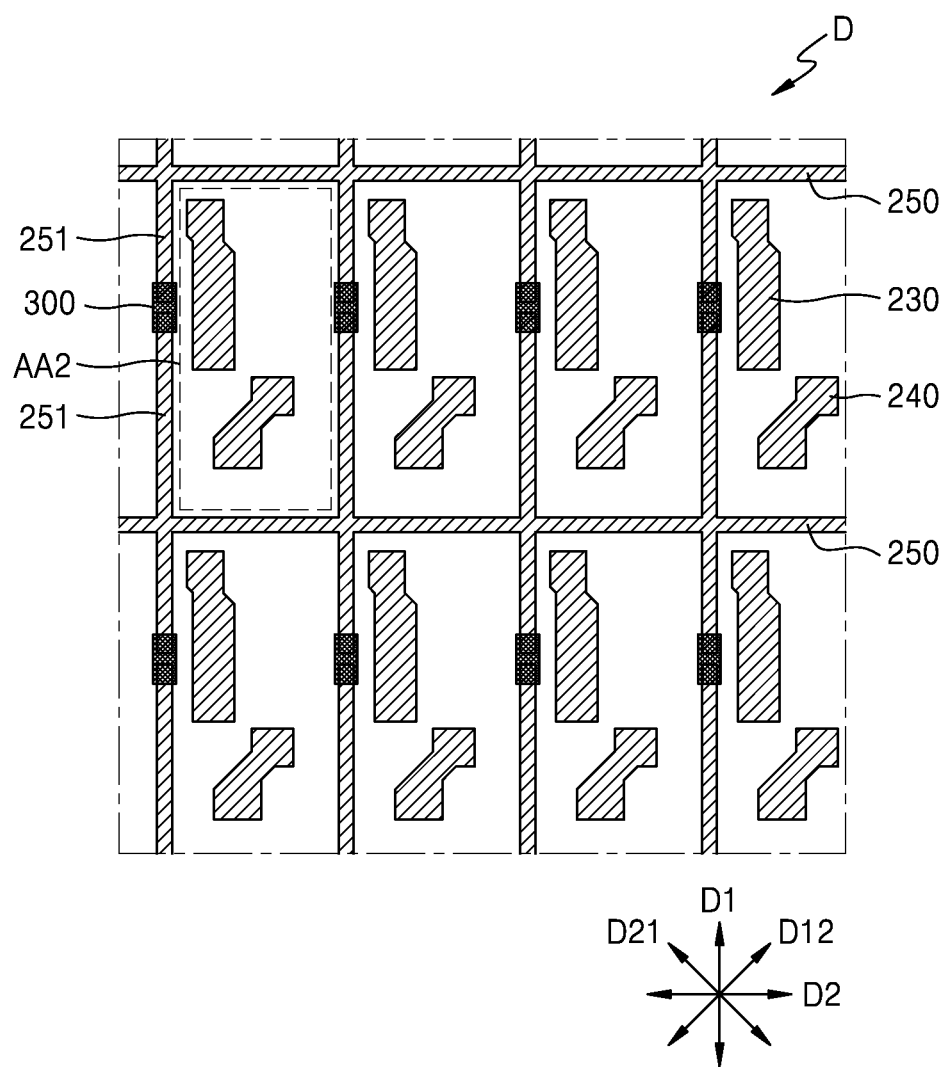

FIGS. 6, 7, and 8 are plan views illustrating an example of the first line 200 and a fourth line 250 according to an embodiment. FIG. 6 is a partially enlarged plan view of region B in FIG. 1, FIG. 7 is an enlarged plan view of region C in FIG. 1, and FIG. 8 is a partially enlarged plan view of region D in FIG. 1.

FIGS. 6 and 7 illustrate the first lines 200 arranged on the right side of the center line CL of FIG. 1, which may be equally applied to the first lines 200 arranged on the left side of the center line CL.

Referring to FIG. 6, in the first sub-area SS1, the first portion 200a and the third portion 200c of the first lines 200 may extend in the first direction D1, and the first portion 200a and the third portion 200c include first branches 211 that protrude in the second direction D2. Hereinafter, the first branches 211 of the first portion 200a will be described as an example, and this may also be applied to the first branches 211 of the third portion 200c.

The first branches 211 of the first portion 200a may symmetrically protrude from the first portion 200a with respect to the first portion 200a of the first line 200. In other words, the first branches 211 may branch from the first portion 200a of the first line 200 extending in the first direction D1 to both sides in the second direction D2. In addition, a pair of first branches 211 branched from two adjacent first portions 200a among the first portions 200a arranged in parallel with each other in the first sub-area SS1 may be located on the same line.

In order to prevent a short circuit in the first lines 200, a discontinued portion (an interval) may be formed in each of the first branches 211 protruding toward each other from two adjacent first portions 200a. Each of the intervals is spaced apart from each other in the first direction D1 and in the second direction D2. In particular, each of the intervals in the second direction D2 is disposed two adjacent first portions 200a. Furthermore, locations of intervals in the first branches 211 are substantially equal to each other in the first direction D1. A black layer 300 may be arranged between the first branches 211 to block external light. That is, the black layer 300 overlaps each of the intervals in the first branches 211.

Referring to FIG. 7, in the second sub-area SS2, the second portions 200b of the first lines 200 may extend in the second direction D2, and each of the second portions 200b may include a second branch 221 that is branched outward from the second portion 200b and extends in the first direction D1. That is, each of second branches 221 may branch from each of the second portion 200b along the first direction D1. In other words, each of the second branches 221 may branch from each of the second portions 200b of the first line 200 extending in the second direction D2 to both sides in the first direction D1. In the second sub-area SS2, a pair of second branches 221 branching from two adjacent second portions 200b may be located on the same line.

In order to prevent a short circuit in the first lines 200, a discontinued portion (an interval) may be formed in each of the second branches 221 protruding toward each other from two adjacent second portions 200b. Each of the intervals is spaced apart from each other in the first direction D1 and in the second direction D2. In particular, each of the intervals in the first direction D1 is disposed two adjacent second portions 200b. Furthermore, locations of intervals in the second branches 221 are substantially equal to each other in the second direction D2. The black layer 300 may be arranged in the interval between the second branches 221 to block external light. That is, the black layer 300 overlaps each of the intervals in the second branches 221.

Referring to FIG. 8, the fourth line 250 may be arranged on the same layer as the layer on which the first lines 200 are arranged, in the second area S2. The fourth line 250 and the first line 200 may include the same material. The fourth line 250 may be spaced apart from and electrically separated from the first lines 200. The fourth line 250 may include third branches 251 that extend in the second direction D2 and branch off in the first direction D1. The third branches 251 may branch from the fourth line 250 with respect to the fourth line 250. In other words, the third branches 251 may branch from the fourth line 250 extending in the second direction D2 to both sides in the first direction D1. In addition, in the second area S2, a pair of third branches 251 branching from two adjacent fourth lines 250 may be located on the same line.

In order to prevent a short circuit between the fourth lines 250, a discontinued portion (an interval) may be formed in each of the third branches 251 protruding toward each other from the two adjacent fourth lines 250. Each of the intervals is spaced apart from each other in the first direction D1 and in the second direction D2. In particular, each of the intervals in the first direction D1 is disposed two adjacent fourth lines 250. Furthermore, locations of intervals in the third branches 251 are substantially equal to each other in the second direction D2. The fourth lines 250 may be connected to each other in the peripheral area PA. In other words, the fourth lines 250 may be integrated. The black layer 300 may be arranged in an interval between the third branches 251 to block external light. That is, the black layer 300 overlaps each of the intervals in the third branches 251.

A plurality of conductive patterns may be further arranged on the same layer as a layer on which the first lines 200 and the fourth lines 250 are arranged. The conductive patterns may include first patterns 230.

The first pattern 230 may function as a shield electrode that prevents signal interference between a circuit element arranged in a lower layer of the first pattern 230 and a pixel electrode arranged in an upper layer of the first pattern 230 in each pixel PX. The first pattern 230 may be electrically connected to the power voltage line PL connected to the pixel PX to receive the first power voltage ELVDD.

The conductive patterns may further include second patterns 240. The second pattern 240 may function as a bridge electrode connecting a circuit element arranged in a lower layer of the second pattern 240 and a pixel electrode arranged in an upper layer of the second pattern 240 in each pixel PX.

Referring to FIGS. 6 and 7, the first pattern 230 and the second pattern 240 in the first area S1 may be arranged in a first pattern area AA1 divided by the first line 200, the first branch 211, and the second branch 221. Referring to FIG. 8, the first pattern 230 and the second pattern 240 in the second area S2 may be arranged in a second pattern area AA2 divided by the fourth line 250 and the third branch 251. The first pattern 230, the second pattern 240, and the fourth line 250 may be in a floating state. In another embodiment, the fourth line 250 may be electrically connected to the power voltage line PL connected to the pixel PX to apply the first power voltage ELVDD.

The first patterns 230 may be physically and electrically separated from the first lines 200 and the fourth lines 250. Although not shown, each of the first patterns 230 of the second area S2 may be connected to the third branch 251 of the fourth line 250 by a bridge. In other words, the fourth lines 250 and the first patterns 230 may be integrated. The fourth lines 250 may receive the first power voltage ELVDD through the first pattern 230 electrically connected to the power voltage line PL.

Figure 9:
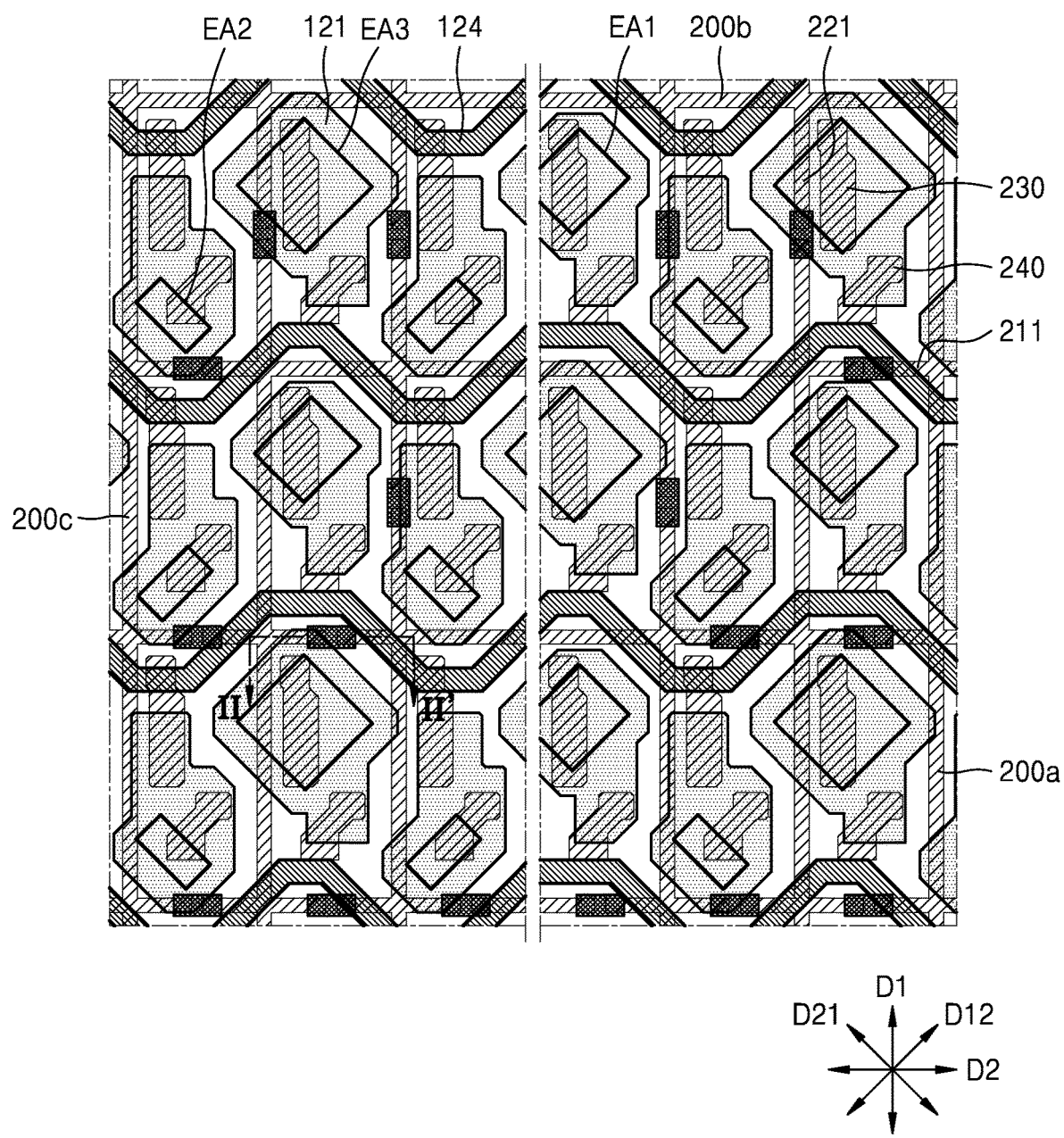
FIGS. 9 and 10 are plan views illustrating a portion of a display panel according to an embodiment.
Figure 10:
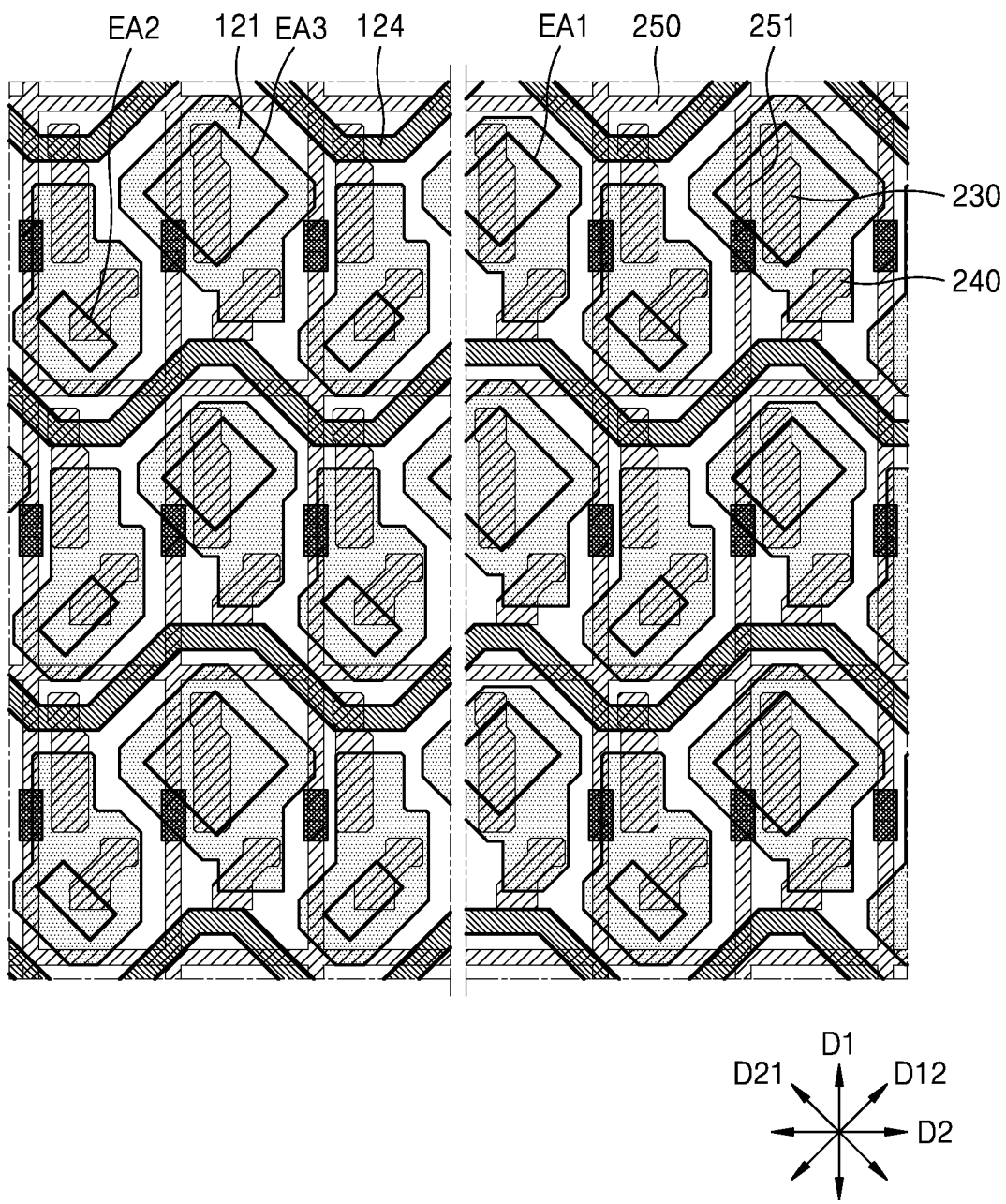
Figure 11:
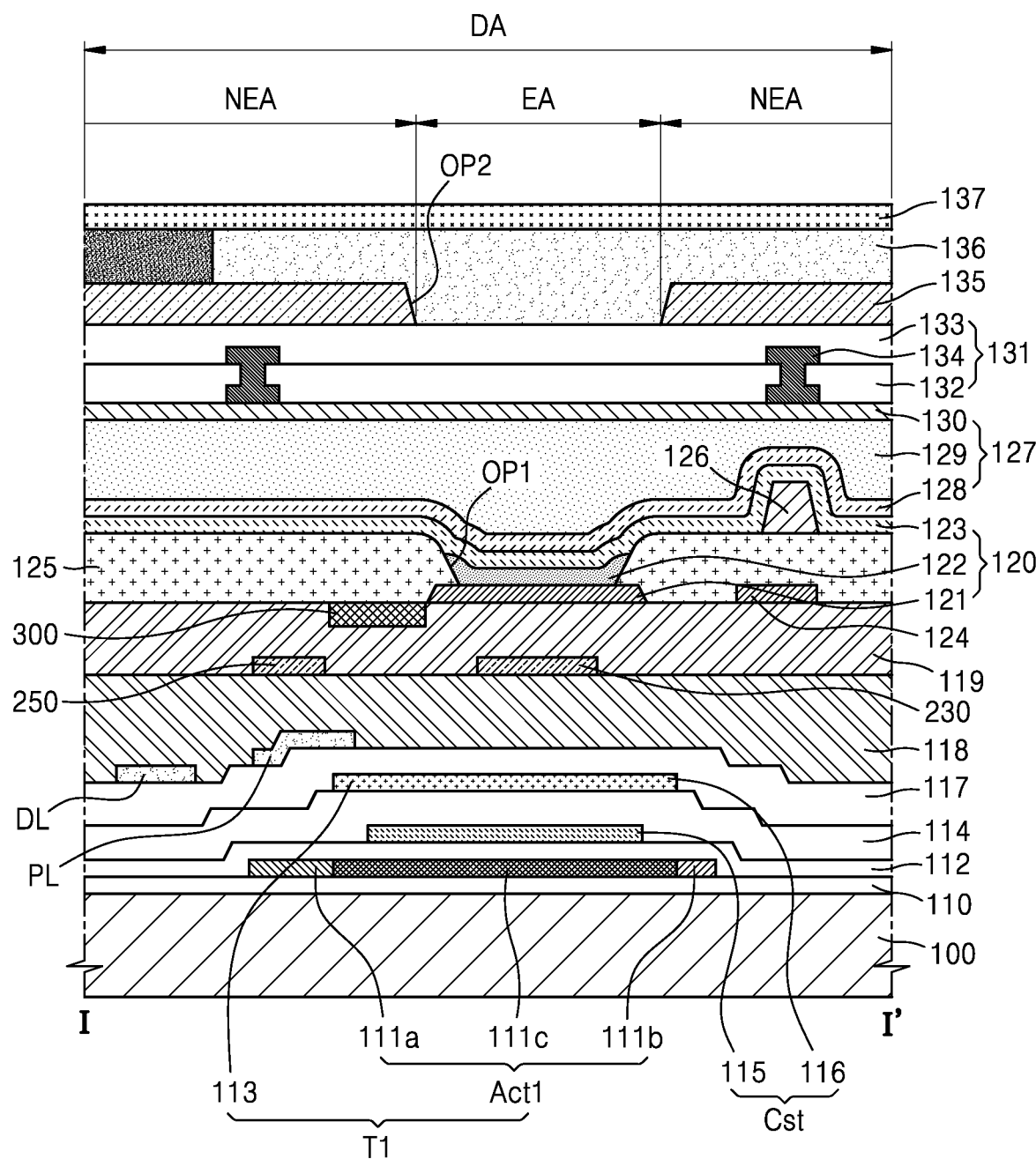
FIG. 11 is a cross-sectional view of the display panel of FIG. 1, taken along line I-I' in FIG. 1, according to an embodiment.
Figure 12:
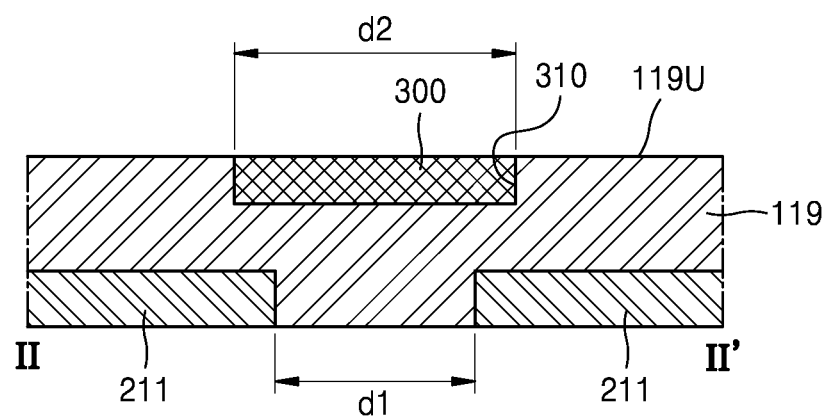
FIG. 12 is a cross-sectional view of the display panel of FIG. 9, taken along line II-II' in FIG. 9, according to an embodiment.

FIGS. 9 and 10 are plan views illustrating a portion of a display panel according to an embodiment, FIG. 11 is a cross-sectional view of the display panel of FIG. 1, taken along line I-I' in FIG. 1, according to an embodiment, and FIG. 12 is a cross-sectional view of the display panel of FIG. 9, taken along line II-II' in FIG. 9, according to an embodiment.

FIG. 9 is a plan view illustrating an arrangement of the first line 200 and a pixel electrode 121 according to an embodiment, FIG. 10 is a plan view illustrating an arrangement of the fourth line 250 and the pixel electrode 121 according to an embodiment, FIG. 11 is a plan view illustrating a stacked structure of some elements included in the pixel PX arranged in the display area DA of a substrate and some lines connected to the pixel PX, and FIG. 12 is a plan view illustrating an arrangement of the first line 200 and the black layer 300 according to an embodiment. Here, FIG. 11 is a cross-sectional view of a portion corresponding to the first transistor T1, the capacitor Cst, and the organic light-emitting diode OLED shown in FIG. 5.

Hereinafter, a description will be given with reference to FIGS. 9, 10, 11, and 12.

The substrate 100 may include various materials such as glass, metal, or plastic. For example, the substrate 100 may be a flexible substrate, and for example, may include a polymer resin such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 may have a multi-layer structure including a layer including the above-described polymer resin and an inorganic layer (not shown).

A buffer layer 110 may be arranged on the substrate 100. The buffer layer 110 may be a single layer or a multi-layer including an inorganic insulating material such as silicon oxide, silicon nitride, or silicon oxynitride. A barrier layer (not shown) may be further arranged between the substrate 100 and the buffer layer 110 to prevent external air from penetrating therethrough. The buffer layer 110 may be omitted.

The first transistor T1 may be disposed on the buffer layer 110. A semiconductor layer Act1 of the first transistor T1 may include a source area 111a, a drain area 111b, and a channel area 111c which is disposed between the source area 111a and the drain area 111b. The semiconductor layer Act1 may include amorphous silicon, polycrystalline silicon, or an organic semiconductor material. A first insulating layer 112 may be disposed on the semiconductor layer Act1.

A gate electrode 113 may be disposed on the first insulating layer 112. The gate electrode 113 may be a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). A second insulating layer 114 may be disposed on the gate electrode 113.

The capacitor Cst may include a lower electrode 115 and an upper electrode 116 that overlap each other with respect to the second insulating layer 114 therebetween. The capacitor Cst may overlap the first transistor T1. According to an embodiment, the gate electrode 113 may be the lower electrode 115 of the capacitor Cst. According to another embodiment, the capacitor Cst may not overlap the first transistor T1, and the lower electrode 115 of the capacitor Cst may be an independent element separate from the gate electrode 113 of the first transistor T1. The upper electrode 116 of the capacitor Cst may be a single layer or a multi-layer including at least one of Al, Pt, Pd, Ag, Mg, Au, Ni, Nd, Ir, Cr, Li, Ca, Mo, Ti, W, and Cu. The capacitor Cst may overlap a third insulating layer 117.

The first insulating layer 112, the second insulating layer 114, and the third insulating layer 117 may be inorganic insulating layers including an inorganic material such as silicon oxide, silicon nitride, and/or silicon oxynitride.

Various conductive layers may be further disposed on the third insulating layer 117. For example, the data line DL, the power voltage line PL, and source/drain electrodes (not shown) of the first transistor T1, which are disposed on the same layer as a layer on which the data line DL is disposed, the power voltage line PL, may be disposed on the third insulating layer 117. The data line DL, the power voltage line PL, and the source/drain electrodes (not shown) may be disposed on the same layer and may include the same material in the same process.

Each of the data line DL and the power voltage line PL may be a single layer or a multi-layer including molybdenum (Mo), Al, Cu, and Ti. In an embodiment, each of the data line DL and the power voltage line PL may be a multi-layer of a Ti layer, an Al layer, and another Ti layer.

A fourth insulating layer 118 may be disposed on the data line DL and the power voltage line PL. The first line 200 and the fourth line 250 may be disposed on the fourth insulating layer 118. The first line 200 and the fourth line 250 may be a single layer or a multi-layer including at least one of Mo, Al, Cu, Ti, and any alloys thereof. In an embodiment, each of the first line 200 and the fourth line 250 may have a multi-layered structure of a Ti layer, an Al layer, and another Ti layer. The first line 200 and the fourth line 250 may at least partially overlap the power voltage line PL. The first pattern layer 230 and the second pattern layer 240 may be further disposed on the fourth insulating layer 118. The first pattern layer 230 and the second pattern layer 240 may include the same material as the first line 200 and the fourth line 250. A fifth insulating layer 119 may be disposed on the first line 200, the fourth line 250, the first pattern layer 230, and the second pattern layer 240.

The fourth insulating layer 118 and the fifth insulating layer 119 may serve as a planarization layer and may be organic insulating layers. The fourth insulating layer 118 and the fifth insulating layer 119 may include an organic insulating material such as a general-purpose polymer such as poly(methyl methacrylate) (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blends thereof. For example, the fourth insulating layer 118 and the fifth insulating layer 119 may include PI.

An organic light-emitting diode 120 may be disposed as a display element on the fifth insulating layer 119. The organic light-emitting diode 120 may include the pixel electrode 121, an emission layer 122, and the opposite electrode 123.

Light incident from the outside may be blocked by the pixel electrode 121, and thus, may not reach the first pattern layer 230 or the second pattern layer 240 disposed under the pixel electrode 121. On the other hand, the light incident from the outside may generate diffuse reflection at the interval between branches of the first line 200 disposed around the pixel electrode 121 or at the interval between branches of the fourth line 250, for example, at an interval between the adjacent first branches 211 of the first line 200, at the interval between the adjacent second branches 221 of the first line 200, or at the interval between the adjacent third branches 251 of the fourth line 250.

To prevent this, as shown in FIG. 12, the black layer 300 may be formed on the fifth insulating layer 119. The black layer 300 may be disposed on the fifth insulating layer 119 at a position corresponding to a plurality of adjacent branches. In FIG. 12, although the first branches 211 adjacent to the first line 200 are illustrated and described, the same may also be applied to the second branches 221 adjacent to the first line 200 and the third branches 251 adjacent to the fourth line 250.

A trench 310 may be disposed in an upper surface of the fifth insulating layer 119. The trench 310 may be recessed by a certain depth from an upper surface 119U of the fifth insulating layer 119. The trench 310 may be disposed at a position vertically corresponding to an interval d1 which is disposed between the two adjacent first branches 211. The trench 310 may be disposed at every interval d1 in the first branches 211. An interval d2 extending from one end to the other end of the trench 310 may be greater than the interval d1 between the first branches 211. The trench 310 may be sized to overlap an entirety of the interval d1 which is disposed between the first branches 211.

The black layer 300 may fill the trench 310. The black layer 300 includes a light-blocking material. The black layer 300 may include a black-based material, for example, any one of a black organic material, a black inorganic material, carbon black, carbon nanotube, and metal black. In addition, the black layer 300 may include a photosensitive organic material and a colorant such as a pigment or a dye. The black layer 300 may be a single layer or a multi-layer. The black layer 300 is disposed at each of the interval between the branches of the first line 200 disposed around the pixel electrode 121 or an interval which is disposed between the branches of the fourth line 250 disposed around the pixel electrode 121, and thus, may prevent external light from proceeding to the interval which is disposed between the branches of the first line 200 or the interval which is disposed between the branches of the fourth line 250, thus suppressing diffuse reflection.

The pixel electrode 121 may be disposed on the fifth insulating layer 119. For example, the pixel electrode 121 may include a conductive oxide such as indium tin oxide (ITO), indium zinc oxide (IZO), zinc oxide (ZnO), indium oxide ($In_2O_3$), indium gallium oxide, or aluminum zinc oxide (AZO).

In another embodiment, the pixel electrode 121 may include a reflective layer including Ag, Mg, Al, Pt, Pd, Au, Ni, Nd, Ir, Cr, or any compounds thereof. According to another embodiment, the pixel electrode 121 may further include a layer including ITO, IZO, ZnO, or $In_2O_3$ on and under the above-described reflective layer.

A shielding member 124 may be further disposed on the fifth insulating layer 119. The shielding member 124 may extend in the second direction D2 along a portion of an edge of the pixel electrode 121 so as not to overlap the pixel electrode 121 on a plane, and may be disposed above or below each row. The shielding member 124 may extend in a straight line or a zigzag shape in the second direction D2 according to the arrangement of the pixel electrodes 121 in the same row.

The shielding member 124 may include a light-shielding metal. The shielding members 124 may be spaced apart from each other and may be independently provided at every row. The shielding members 124 may be floated, and may be electrically connected to a constant voltage line (e.g., a power voltage line, an initialization voltage line, etc.) to receive a constant voltage.

A sixth insulating layer 125 may be disposed on the fifth insulating layer 119. A first opening OP1 corresponding to each of the pixels is defined in the sixth insulating layer 125, That is, the first opening OP1 exposes a portion of the pixel electrode 121. The sixth insulating layer 125 may serve as a pixel-defining layer.

The sixth insulating layer 125 may include an organic material such as acryl, benzocyclobutene (BCB), PI, or hexamethyldisiloxane (HMDSO). In an embodiment, the sixth insulating layer 125 may include a light-blocking material to reduce external light reflection. For example, the sixth insulating layer 125 may be a black organic material. In another embodiment, the sixth insulating layer 125 may include the inorganic material described above.

A spacer 126 may be further formed on the sixth insulating layer 125. The spacer 126 may be formed of the same material as the sixth insulating layer 125 in the same process. According to another embodiment, the spacer 126 may be formed of a material different from that of the sixth insulating layer 125 in other processes.

An area exposed by the first opening OP of the sixth insulating layer 125 in the pixel electrode 121 may be defined as an emission area EA. An emission layer 122 may be disposed in the emission area EA. An emission area EA1 of the first pixel, an emission area EA2 of the second pixel, and an emission area EA3 of the third pixel may have different sizes. A non-emission area NEA may be around the emission areas EA, and the non-emission area NEA may surround the emission area EA.

The emission layer 122 may be disposed on the pixel electrode 121 exposed by the first opening OP1 of the sixth insulating layer 125. The emission layer 122 may include a polymer or a low-molecular organic material emitting light of a color. The emission layer 122 may be a red emission layer, a green emission layer, or a blue emission layer. The emission layer 122 may be a multi-layer in which a red emission layer, a green emission layer, and a blue emission layer are stacked to emit white light, or a single layer including a red emission material, a green emission material, and a blue emission material.

According to an embodiment, a first functional layer may be further included under the emission layer 122, and a second functional layer may be further included on the emission layer 122. The first functional layer and/or the second functional layer may each be integrated over the plurality of pixel electrodes 121, or may be a layer patterned to correspond to the plurality of pixel electrodes 121, respectively.

The first functional layer may be a single layer or a multi-layer. For example, when the first functional layer includes a polymer material, the first functional layer may be formed of poly(3,4)-ethylenedihydroxythiophene (PEDOT) or polyaniline (PANI) as a Hole Transport Layer (HTL) that is a single layer. When the first functional layer includes a low-molecular material, the first functional layer may include a Hole Injection Layer (HIL) and the HTL.

The second functional layer is not always provided. For example, when each of the first functional layer and the emission layer includes a polymer material, the second functional layer may be formed to improve characteristics of the organic light-emitting diode OLED. The second functional layer may be a single layer or a multi-layer. The second functional layer may include an Electron Transport Layer (ETL) and/or an Electron Injection Layer (EIL).

The opposite electrode 123 may face the pixel electrode 121 with the emission layer 122 therebetween. The opposite electrode 123 may include a conductive material having a low work function. For example, the opposite electrode 123 may include a (semi) transparent layer including Ag, Mg, Al, Pt, Pd, Au, Ni, Nd, Ir, Cr, Li, Ca, or any alloys thereof. Alternatively, the opposite electrode 123 may further include a layer such as ITO, IZO, ZnO, or $In_2O_3$ on the (semi) transparent layer including the above-described material.

The opposite electrode 123 may be disposed on the emission layer 122, the sixth insulating layer 125, and the spacer 126. The opposite electrode 123 may be a common electrode that faces the plurality of pixel electrodes 121 and is integrated with the plurality of organic light-emitting diodes OLED in the display area DA.

An encapsulation layer 127 may be disposed on the organic light-emitting diode OLED. The encapsulation layer 127 may include first and second inorganic encapsulation layers 128 and 130 each including at least one inorganic material and an organic encapsulation layer 129 including at least one organic material. The organic encapsulation layer 129 may have a thickness greater than that of the first and second inorganic encapsulation layers 128 and 130. In some embodiments, the encapsulation layer 127 may have a stacked structure of the first inorganic encapsulation layer 128, the organic encapsulation layer 129, and the second inorganic encapsulation layer 130.

A capping layer (not shown) may be further disposed between the opposite electrode 123 and the encapsulation layer 127. As an embodiment, a sealing substrate (not shown) may be disposed on the organic light-emitting diode OLED, and may be bonded to the substrate 100 by a sealing member such as a sealant or frit outside the display area DA.

A touch sensing layer 131 may be disposed on the encapsulation layer 127. The touch sensing layer 131 may include a first insulating layer 132, a second insulating layer 133 disposed on the first insulating layer 132, and a plurality of touch electrodes 134 disposed between the first insulating layer 132 and the second insulating layer 133. As an embodiment, the touch electrode 134 may include various electrode structures such as a mesh electrode pattern, a transparent segment electrode, and the like. The touch sensing layer 131 may sense a touch input based on a change in mutual capacitance generated by a touch input.

A black matrix 135 and a color filter 136 may be disposed on the touch sensing layer 131. The black matrix 135 may include a material capable of blocking light. The black matrix 135 may include a black material. The black matrix 135 may be a single layer or a multi-layer. A second opening OP2 at a position corresponding to the first opening OP1 of the sixth insulating layer 125 may be defined in the black matrix 135. The second opening OP2 of the black matrix 135 may be larger than the first opening OP1 of the sixth insulating layer 125. That is, the second opening OP2 overlaps the entirety of the first opening OP1. As the second opening OP2 of the black matrix 135 increases, the side visibility of the display panel 10 may be improved. The black matrix 135 disposed in the peripheral area PA may surround the entire peripheral area PA without an opening. The black matrix 135 surrounding the peripheral area PA may reduce reflection of external light due to various lines disposed in the peripheral area PA.

The color filter 136 may be disposed in the emission area EA of each pixel. The color filter 136 may include a plurality of colors corresponding to the emission area EA of each pixel. The color filter 136 may be disposed in the second opening OP2 of the black matrix 135 for each color. For example, when the first pixel emits red light, a first color filter may f filter red light, when the second pixel emits green light, a second color filter may filter green light, and when the third pixel emits blue light, a third color filter may filter blue light.

In general, a polarizing film having a considerable thickness is used to reduce external light reflection, but in the present embodiment, the color filter 136 is used so that a polarizing film is not required.

An overcoating layer 137 may be further disposed on the black matrix 135 and the color filter 136 to protect the color filter 136.

FIGS. 13A, 13B, 13C, 13D, and 13E are cross-sectional views sequentially illustrating a process of manufacturing the display panel 10.

Figure 13A:
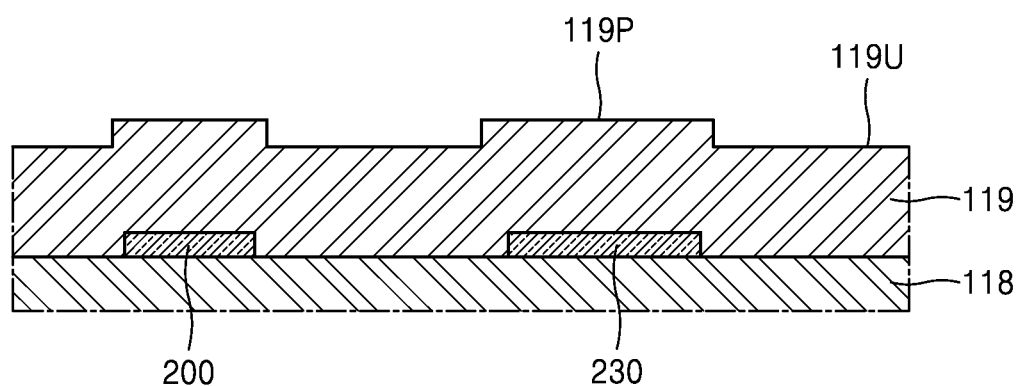
FIGS. 13A, 13B, 13C, 13D, and 13E are cross-sectional views sequentially illustrating a process of manufacturing a display panel, according to one or more embodiments.

Referring to FIG. 13A, the first line 200 and the first pattern layer 230 may be formed on the fourth insulating layer 118. Although the first line 200 including the first branches 211 and the second branches 221 is illustrated in FIG. 13A, the same may also be applied to the fourth line 250 including the third branches 251.

The fifth insulating layer 119 may be formed on the first line 200 and the first pattern layer 230. The fifth insulating layer 119 may be formed by various methods such as coating, deposition, and printing. A step portion 119P of the fifth insulating layer 119 may be formed on the first line 200 and the first pattern layer 230. In detail, because the first line 200 and the third pattern layer 230 have thicknesses, the step portion 119P protruding from the upper surface 119U of the fifth insulating layer 119 may be formed in an area in which the first line 200 and the first pattern layer 230 are patterned when the fifth insulating layer 119 is formed. The thickness of the step portion 119P may correspond to the thicknesses of the first line 200 and the first pattern layer 230.

Figure 13B:
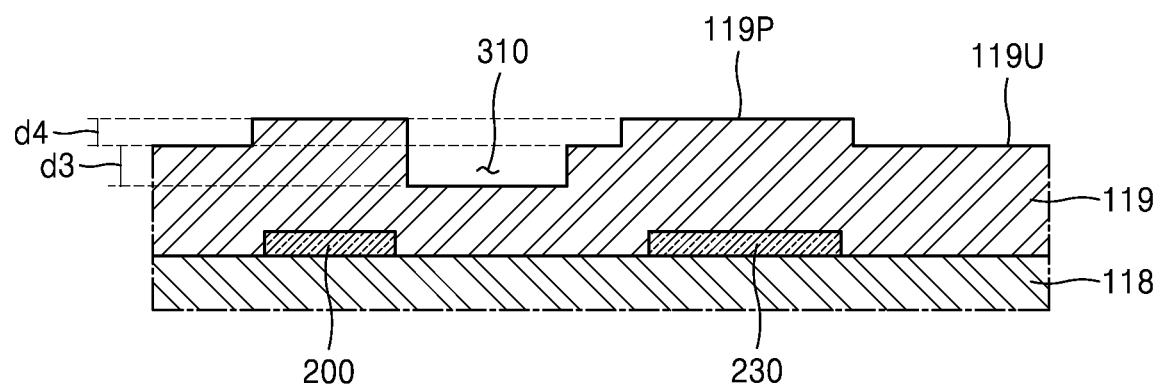

Referring to FIG. 13B, the trench 310 may be formed in the fifth insulating layer 119. In detail, the trench 310 recessed by a certain depth from the upper surface 119U of the fifth insulating layer 119 may be formed using a halftone mask. A depth d3 of the trench 310 may be greater than a thickness d4 of the step portion 119P. As described above, the trench 310 may be formed at a position vertically corresponding to the interval (d1 of FIG. 12) between the adjacent first branches 211 of the first line 200. The trench 310 may be formed at every interval d1 between the first branches 211. The trench 310 may have a size to cover the interval d1.

Figure 13C:
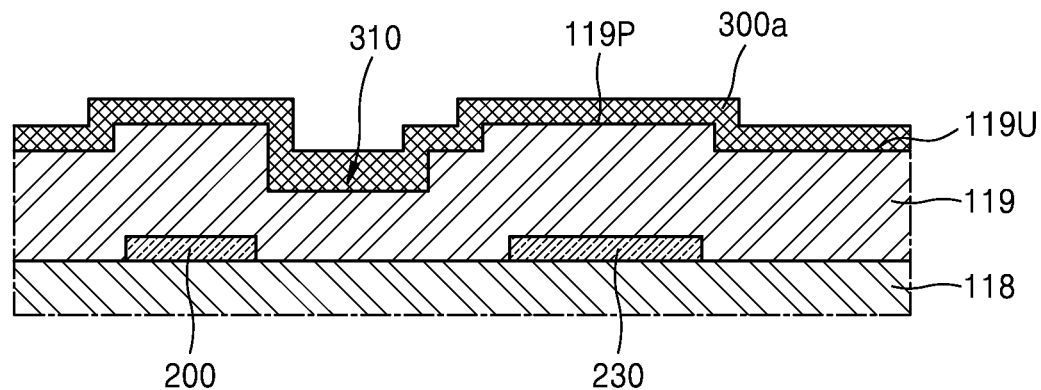

Referring to FIG. 13C, a black layer raw material 300a may be coated on the fifth insulating layer 119. The black layer raw material 300a may include a light-blocking material. For example, the black layer raw material 300a may include a black-based material, for example, any one of a black organic material, a black inorganic material, carbon black, carbon nanotubes, and metal black. In addition, the black layer raw material 300a may include a photosensitive organic material and may include a colorant such as a pigment or a dye.

The black layer raw material 300a may be coated on the upper surface 119U of the fifth insulating layer 119, the step portion 119P of the fifth insulating layer 119, and the trench 310. A thickness of the black layer raw material 300a may be arbitrarily controlled as long as the black layer raw material 300a may be filled in the trench 310.

Figure 13D:
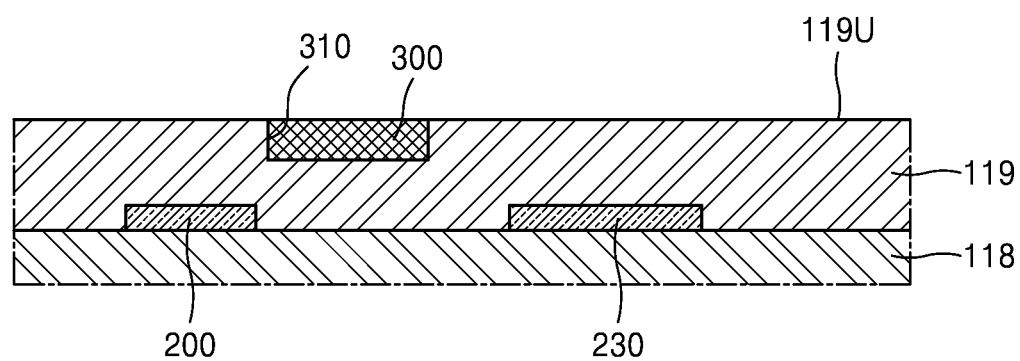

Referring to FIG. 13D, the upper surface 119U of the fifth insulating layer 119 may be planarized. For example, the upper surface 119U of the fifth insulating layer 119 may be planarized by a Chemical Mechanical Polishing (CMP) process. During the CMP process, the black layer raw material 300a coated on the upper surface 119U of the fifth insulating layer 119 and the step portion 119P of the fifth insulating layer 119 may be removed. In addition, the step portion 119P of the fifth insulating layer 119 protruding from the upper surface 119U of the fifth insulating layer 119 may be removed. Accordingly, the upper surface 119U of the fifth insulating layer 119 may be a flat surface. On the other hand, the black layer raw material 300a coated in the trench 310 may remain in the trench 310, thereby forming the black layer 300.

Figure 13E:
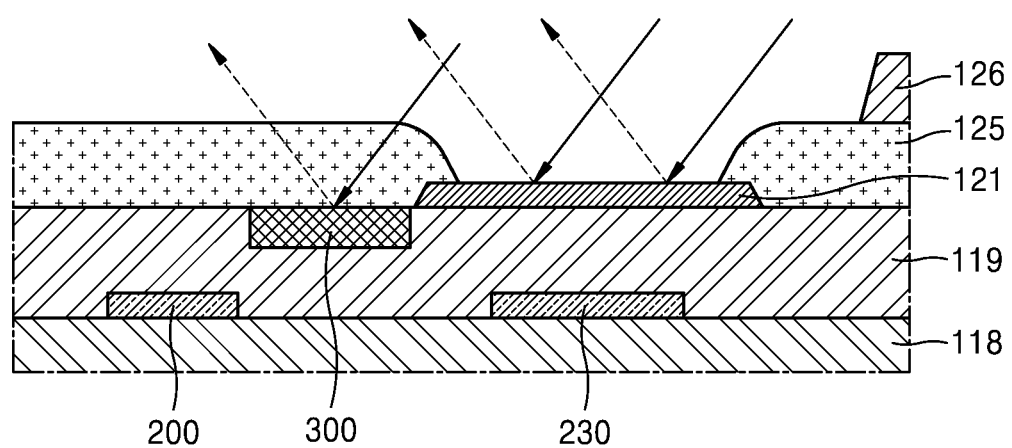

Referring to FIG. 13E, the pixel electrode 121 may be formed on the upper surface 119U of the fifth insulating layer 119. The pixel electrode 121 may be patterned around the black layer 300. In an embodiment, the black layer 300 may be disposed adjacent to the pixel electrode 121. According to another embodiment, at least a portion of the black layer 300 may overlap the pixel electrode 121. The black layer 300 is not limited to any position as long as it covers the interval d1 between the adjacent first branches 211 of the first line 200. The black layer 300 is formed at every interval d1 between adjacent first branches 211 of the first line 200.

Next, the sixth insulating layer 125 exposing a portion of the pixel electrode 121 may be formed on the upper surface 119U of the fifth insulating layer 119. The sixth insulating layer 125 may function as a pixel-defining layer. The sixth insulating layer 125 may include a light-blocking material to reduce external light reflection. For example, the sixth insulating layer 125 may be a black-based organic material.

The spacer 126 may be formed on the sixth insulating layer 125. The spacer 126 may include the same material as the sixth insulating layer 125 in the same process.

Through the above-described process, the black layer 300 may be formed at a position vertically corresponding to an interval between the first branches 211 of the first line 200, an interval between the second branches 221, or an interval between the third branches 251 of the fourth line 250 in a vertical direction. Accordingly, when light is incident from the outside, the black layer 300 may block the external light from traveling at the interval of the first line 200 or the interval of the fourth line 250, thereby suppressing diffuse reflection.

In addition, the black layer 300 covers the interval which is disposed between the branches of the first line 200 or the interval between the branches of the fourth line 250, and thus, due to the interval of the branches of the first line 200 or the interval of the branches of the fourth line 250 in the display area DA of the display panel 10, a dummy wiring that is unnecessarily patterned may be omitted.

Furthermore, because the black layer 300 covers the interval between the branches of the first line 200 or the interval between the branches of the fourth line 250, visibility generated due to the interval between the branches of the first line 200 and the interval between the branches of the fourth line 250 in the display area DA of the display panel 10 may be effectively prevented.

In addition, because the black layer 300 covers the interval between the branches of the first line 200 or the interval between the branches of the fourth line 250, White Angle Dependency (WAD) may be improved.

According to an aspect of the present disclosure, a display device and a method of manufacturing the display device may prevent diffuse reflection and a line pattern from being perceived by arranging a black layer on lines disposed around a pixel electrode.

The effect of the present disclosure may be derived from the contents described below with reference to the drawings, in addition to the above-described contents.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure including the following claims.

What is claimed is:

1. A display device comprising:
   a substrate having a top surface including a display area and a peripheral area which is disposed outside the display area;
   a plurality of data lines disposed on the top surface;
   a plurality of lines disposed in the display area, respectively connected to the plurality of data lines, and configured to respectively transmit a data signal from a driving circuit disposed in the peripheral area to the plurality of data lines;
   an insulating layer covering the plurality of lines; and
   a light-emitting element disposed on the insulating layer,
   wherein each of the plurality of lines includes a plurality of branches branched in a direction crossing an extending direction of each of the plurality of lines, and
   a black layer is disposed on the insulating layer at a position corresponding to an interval which is disposed between a plurality of adjacent ones of the plurality of branches in a vertical direction with respect to the top surface.

2. The display device of claim 1, wherein the black layer is disposed in a trench that is recessed from an upper surface of the insulating layer.

3. The display device of claim 2, wherein the light-emitting element includes a pixel electrode, an emission layer, and an opposite electrode, and
   the black layer is disposed adjacent to the pixel electrode and overlaps the interval which is disposed between the plurality of adjacent branches.

4. The display device of claim 3, wherein the black layer is disposed at every interval which is disposed between a plurality of branches protruding from the plurality of lines disposed around the pixel electrode.

5. The display device of claim 1, wherein the black layer includes any one of a black organic material, a black inorganic material, carbon black, carbon nanotube, and metal black.

6. The display device of claim 1, wherein the plurality of lines are disposed to be parallel and spaced apart from each other, and
   the interval is disposed between ends of a pair of branches protruding toward each other from two adjacent lines.

7. The display device of claim 1, wherein each of the plurality of lines include a first portion, a second portion, and a third portion, and the second portion connects the first portion to the third portion, and
   each of the first portion and the third portion extends in the extending direction of the plurality of data lines, and the second portion extends in a direction crossing the extending direction of the plurality of data lines.

8. The display device of claim 7, wherein each of the plurality of lines includes first branches protruding from the first portion and the third portion, respectively, and second branches protruding from the second portion.

9. A display device comprising:
   a substrate having a top surface comprising a display area;
   a plurality of lines, each of the plurality of lines extending in one direction of the display area and each of the plurality of lines comprising a plurality of branches branched in a direction crossing an extending direction;
   an insulating layer overlapping the plurality of lines; and
   a light-emitting element disposed on the insulating layer,
   wherein a black layer is disposed on the insulating layer at a position corresponding to an interval which is disposed between a plurality of adjacent ones of the plurality of branches in a vertical direction with respect to the top surface.

10. The display device of claim 9, wherein the black layer is disposed in a trench that is recessed from an upper surface of the insulating layer.

11. The display device of claim 9, wherein the light-emitting element includes a pixel electrode, an emission layer, and an opposite electrode, and
    the black layer is disposed adjacent to the pixel electrode and overlaps the interval which is disposed between the plurality of adjacent branches.

12. The display device of claim 9, wherein the black layer is disposed at every interval which is disposed between a plurality of branches protruding from the plurality of lines disposed around the pixel electrode.

13. The display device of claim 9, wherein the black layer includes any one of a black organic material, a black inorganic material, carbon black, carbon nanotube, and metal black.

* * * * *